(12) United States Patent
Kang et al.

(10) Patent No.: US 12,704,554 B2
(45) Date of Patent: Aug. 11, 2026

(54) SECONDARY BATTERY LOW-VOLTAGE DEFECT DETERMINATION SYSTEM AND SECONDARY BATTERY DEFECT DETERMINATION METHOD USING THE SAME

(71) Applicant: LG ENERGY SOLUTION, LTD., Seoul (KR)

(72) Inventors: Joon Sup Kang, Daejeon (KR); Nak Gi Sung, Daejeon (KR); Sung Tae Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 417 days.

(21) Appl. No.: 18/039,102

(22) PCT Filed: Oct. 21, 2022

(86) PCT No.: PCT/KR2022/016101

§ 371 (c)(1),
(2) Date: May 26, 2023

(87) PCT Pub. No.: WO2023/075297

PCT Pub. Date: May 4, 2023

(65) Prior Publication Data

US 2024/0103085 A1 Mar. 28, 2024

(30) Foreign Application Priority Data

Oct. 26, 2021 (KR) ........................ 10-2021-0143263

(51) Int. Cl.
*G01R 31/3835* (2019.01)
*G01R 31/367* (2019.01)

(52) U.S. Cl.
CPC ....... *G01R 31/3835* (2019.01); *G01R 31/367* (2019.01)

(58) Field of Classification Search
CPC ......................... G01R 31/3835; G01R 31/367; G01R 31/382; G01R 31/36; G01R 31/00;
(Continued)

(56) References Cited

U.S. PATENT DOCUMENTS 5,994,878 A * 11/1999 Ostergaard ............ H02J 7/0071 320/132
2005/0088143 A1 * 4/2005 Yang ..................... H02J 7/0048 320/130
(Continued)

FOREIGN PATENT DOCUMENTS

CN 101688899 A 3/2010
CN 102983371 A 3/2013
(Continued)

OTHER PUBLICATIONS

International Search Report (PCT/ISA/210) issued in PCT/KR2022/016101, dated Feb. 6, 2023.
(Continued)

*Primary Examiner* — Mohamed Charioui
(74) *Attorney, Agent, or Firm* — Birch, Stewart, Kolasch & Birch, LLP

(57) ABSTRACT

Discussed is a secondary battery low-voltage defect determination system, which can include a database unit configured to store existing data on battery manufacturing process conditions, activation process conditions, voltage measurement conditions, and a battery voltage measured after an activation process of a battery, a detection unit configured to detect experimental data on the manufacturing process conditions, the activation process conditions, the voltage measurement conditions, and the battery voltage measured after the activation process of the battery, and a calculation unit configured to calculate target voltage drop correction data
(Continued)

based on the existing data stored in the database unit and the experimental data detected by the detection unit.

14 Claims, 4 Drawing Sheets

(58) Field of Classification Search
CPC .... G01R 31/52; G01R 31/50; G01R 31/3865; G01R 31/385; G01R 31/3648; G01R 31/3644; G01R 31/374; G01R 31/3842; G01R 31/392; H01M 10/4285; H01M 10/48; H01M 10/42; H01M 10/00; Y02E 60/10; Y02E 60/00; H02J 7/0047; H02J 7/00
See application file for complete search history.

(56) References Cited

U.S. PATENT DOCUMENTS

| | | | | |
|---|---|---|---|---|
| 2009/0088992 | A1 | 4/2009 | Matsumura et al. | |
| 2011/0112782 | A1* | 5/2011 | Majima | H01M 10/48 324/427 |
| 2015/0137824 | A1* | 5/2015 | Nishihara | B60L 3/12 320/136 |
| 2019/0033380 | A1 | 1/2019 | Kim et al. | |
| 2021/0135304 | A1 | 5/2021 | Lee et al. | |
| 2022/0043068 | A1 | 2/2022 | Lee et al. | |

FOREIGN PATENT DOCUMENTS

| | | | | |
|---|---|---|---|---|
| CN | 106610475 | A | 5/2017 | |
| CN | 108780127 | A | 11/2018 | |
| CN | 109143103 | A | 1/2019 | |
| CN | 112888954 | A | 6/2021 | |
| CN | 113296005 | A | 8/2021 | |
| JP | 2005-251537 | A | 9/2005 | |
| JP | 2011-64646 | A | 3/2011 | |
| JP | 2013-134843 | A | 7/2013 | |
| JP | 5457355 | B2 | 4/2014 | |
| JP | 2021-57318 | A | 4/2021 | |
| KR | 10-2015-0049528 | A | 5/2015 | |
| KR | 10-2017-0049196 | A | 5/2017 | |
| KR | 10-1800050 | B1 | 11/2017 | |
| KR | 10-1818515 | B1 | 1/2018 | |
| KR | 10-2018-0080914 | A | 7/2018 | |
| KR | 10-2019-0100500 | A | 8/2019 | |
| KR | 10-2020-0039215 | A | 4/2020 | |
| KR | 20200039215 | * | 4/2020 | G01R 31/3842 |
| KR | 10-2020-0084510 | A | 7/2020 | |
| KR | 10-2021-0030089 | A | 3/2021 | |

OTHER PUBLICATIONS

Chinese Office Action and Search Report for Chinese Application No. 202280007940.6, dated Feb. 12, 2026, with English translation.
Qiwen et al., “Analytical Chemistry,” China Medical Science Press, Aug. 2021, 12 pages total, with English abstract.

* cited by examiner

[FIG. 1]

[FIG. 2]
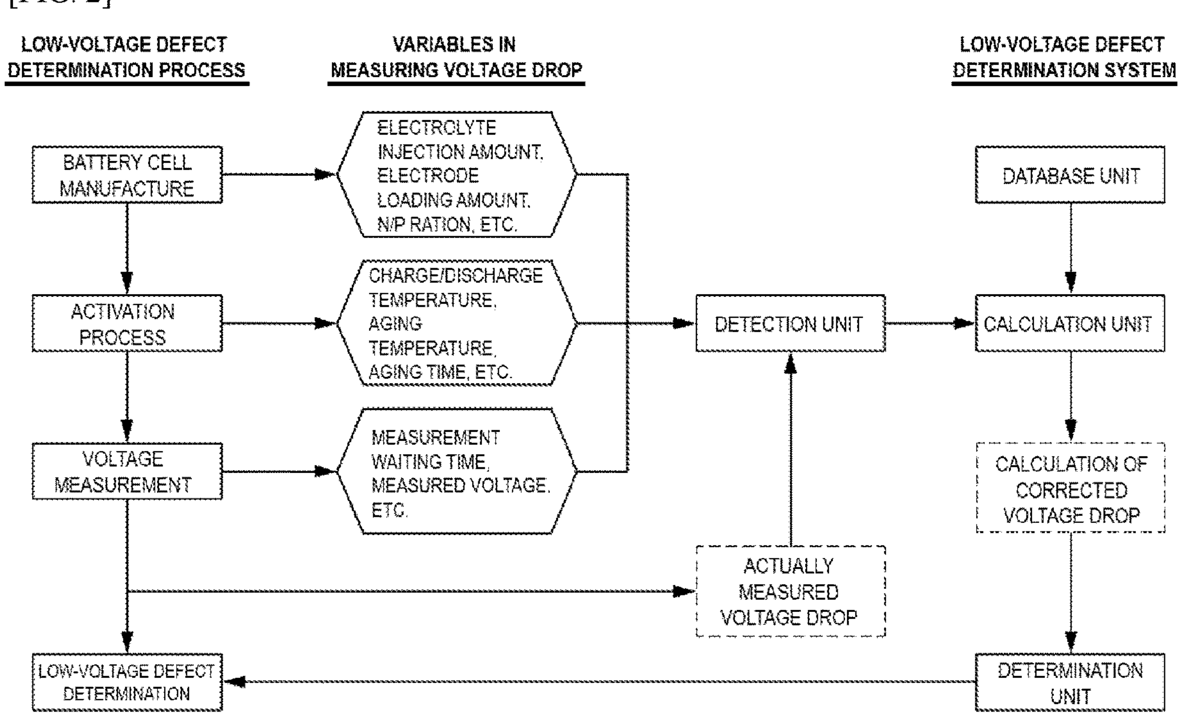

[FIG. 3]
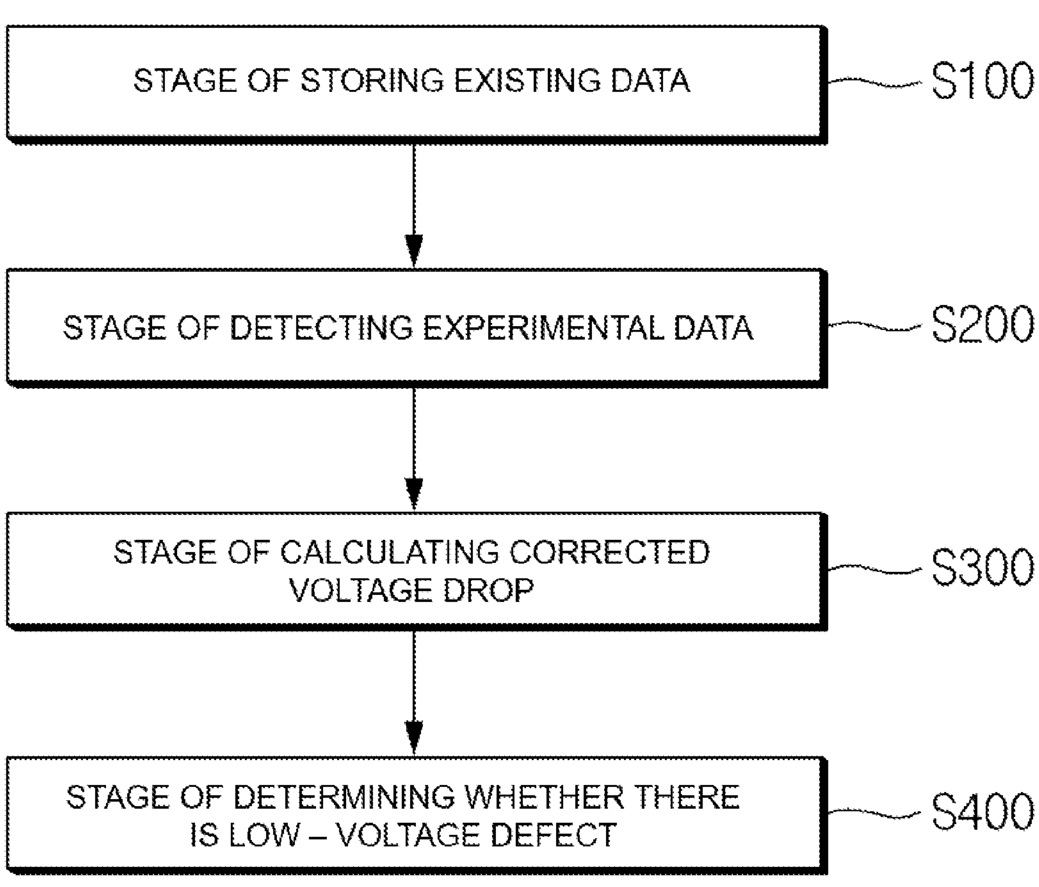

[FIG. 4]
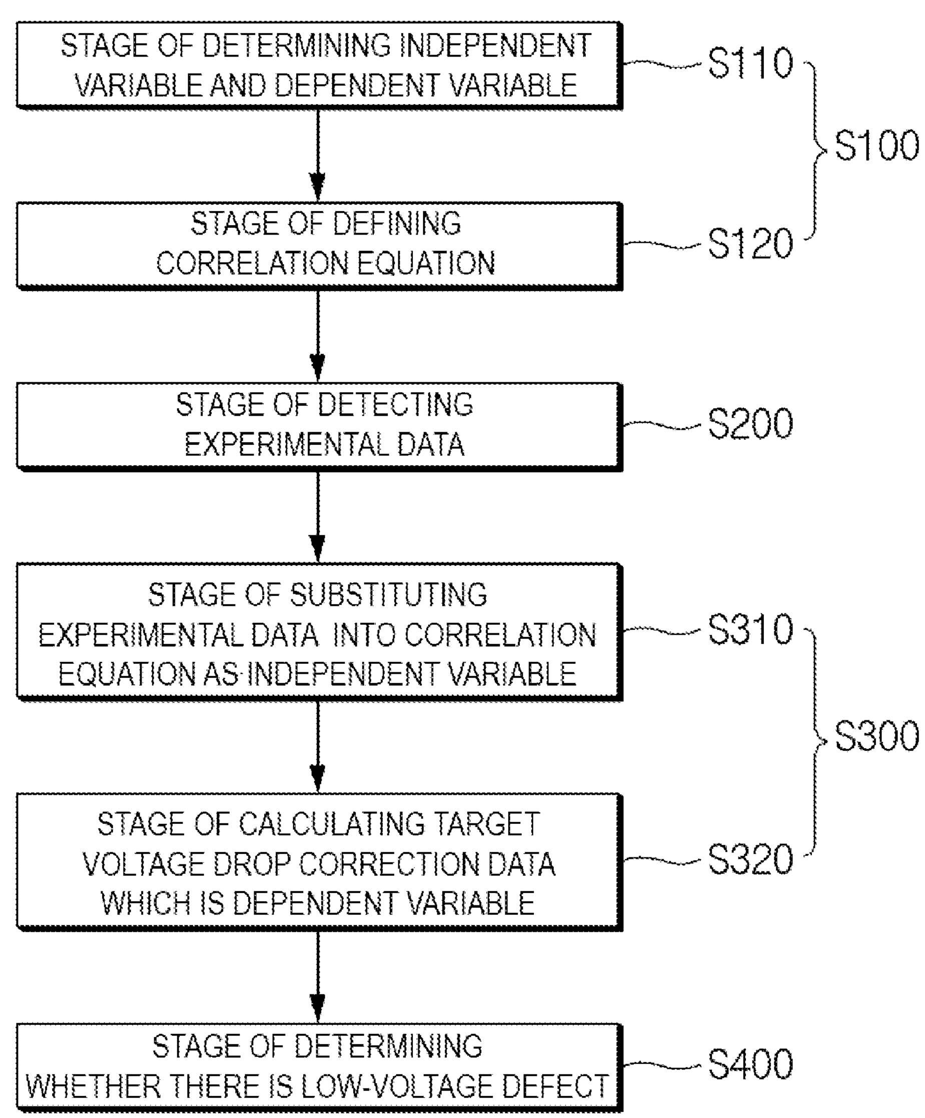

SECONDARY BATTERY LOW-VOLTAGE DEFECT DETERMINATION SYSTEM AND SECONDARY BATTERY DEFECT DETERMINATION METHOD USING THE SAME

TECHNICAL FIELD

This application claims the benefit of a priority based on Korean Patent Application No. 10-2021-0143263, filed on Oct. 26, 2021, and the entire contents of the Korean patent application are incorporated herein by reference.

The present invention relates to a secondary battery low-voltage defect determination system and a secondary battery defect determination method using the same.

BACKGROUND TECHNOLOGY OF THE INVENTION

Recently, interest in the price rise of energy sources and environmental pollution due to the depletion of fossil fuels has increased, and the demand for eco-friendly alternative energy sources is essentially being accepted for future life. Accordingly, research on various power production technologies such as nuclear power, solar power, wind power, and tidal power are being continued, and power storage devices for a more efficient use of energy produced this way are also receiving a great interest.

In particular, as technology development and demand for mobile devices increase, the demand for batteries as an energy source has been rapidly increasing, and accordingly, a lot of research is being conducted on batteries that can meet various needs.

Typically, in terms of the shape of the battery, there is a high demand for prismatic secondary batteries and pouch-type secondary batteries that can be applied to products such as mobile phones by having a thin thickness. In terms of materials, there is a high demand for lithium secondary batteries such as lithium-ion batteries, lithium-ion polymer batteries, etc., which have advantages such as high energy density, discharge voltage, output stability, etc.

In general, such a secondary battery is manufactured through various processes such as a process of preparing a primary secondary battery with a structure in which an electrode assembly composed of a cathode, an anode, and a separation membrane interposed therebetween and an electrolyte are stored together in a battery case, an aging process for the primary secondary battery, an activation process of charging and discharging the primary secondary battery, and a degassing process for removing gases generated in the aging process and the charging and discharging process.

In order to prevent low-voltage batteries from being shipped, low-voltage defect in secondary batteries manufactured through processes described above was diagnosed by measuring the voltage drop according to the change of time for a certain period of time after shipment charging, which is the last step in the secondary battery activation process. Here, the low-voltage defect refers to a phenomenon in which a battery exhibits a voltage drop equal to or higher than a preset self-discharge rate.

Meanwhile, in the case of a cell with a low-voltage defect, it has greater leakage current compared to normal cells due to a leakage current continuously generated by the defect in the separation membrane itself insulating the positive and negative electrodes, or by the weakening of the insulation resistance due to a damage in the separation membrane by an impact or an insertion of foreign substances during assembly.

As a method for determining the low-voltage defect of existing secondary batteries, whether the battery is defective was determined based on the absolute value of a simple voltage drop, or was determined by making a relative decision in a specific group unit. But the voltage drop of an actual secondary battery can be greatly affected by manufacturing process conditions, the activation process conditions, and charging conditions, thereby there has been a problem of low accuracy.

DESCRIPTION OF THE INVENTION

Technical Problem

The present invention has been devised to solve the problems mentioned above, and it is directed to provide a secondary battery low-voltage defect determination system and a low-voltage defect determination method using the same, which can calculate voltage drop correction data by quantifying all variables that can affect voltage drop and applying them to a relational expression.

Technical Solution

The secondary battery low-voltage defect determination system according to an exemplary embodiment of the present invention may include: a database unit configured to store existing data on battery manufacturing process conditions, activation process conditions, voltage measurement conditions, and a battery voltage measured after an activation process of a battery; a detection unit configured to detect experimental data on the manufacturing process conditions, the activation process conditions, the voltage measurement conditions, and the battery voltage measured after the activation process of the battery; and a calculation unit configured to calculate target voltage drop correction data based on the existing data stored in the database unit and the experimental data detected by the detection unit In another example, it may further include a determination unit configured to deduce whether the battery has a low-voltage defect by comparing the target voltage drop correction data and reference voltage drop data of a normal battery.

In a specific example, the existing data stored in the database unit and the experimental data detected by the detection unit include one or more of a battery size, an electrolyte injection amount, a type of active material, an electrode loading amount, an N/P ratio, an aging temperature, an aging time, an aging frequency, a charge/discharge temperature, a charge/discharge capacity, a charge/discharge frequency, a charge/discharge time, an electrolyte discharge amount, a voltage measurement waiting time, a measurement voltage/current mode, a measured voltage, and a measured voltage drop.

Meanwhile, the database unit may define a correlation equation through a correlation analysis between the existing data and the target voltage drop correction data.

In a specific example, the correlation analysis may be a regression analysis with the existing data as an independent variable and the target voltage drop correction data as a dependent variable.

In another specific example, the calculation unit may calculate the target voltage drop correction data by substituting the experimental data detected by the detection unit as an independent variable into the correlation equation.

Meanwhile, the number of batteries serving as a population for the correlation analysis may be from about 1,000 to 30,000.

The secondary battery low-voltage defect determination method according to an exemplary embodiment of the present invention may include: an operation of storing, in the database unit, the existing data on the battery manufacturing process conditions, the activation process conditions, the voltage measurement conditions after the activation process, and the measured battery voltage; an operation of detecting, by the detection unit, the experimental data on the manufacturing process conditions, the activation process conditions, the voltage measurement conditions after the activation process, and the measured battery voltage of the battery; and an operation of calculating, by the calculation unit, a corrected voltage drop based on the stored existing data and the detected experimental data.

In another example, it may further include an operation of determining whether the battery has a low-voltage defect by comparing the corrected voltage drop and a reference voltage drop of a normal battery after the operation of calculating the corrected voltage drop.

In another example, the stored existing data and the detected experimental data may include one or more of a battery size, an electrolyte injection amount, a type of active material, an electrode loading amount, an N/P ratio, an aging temperature, an aging time, an aging frequency, a charge/discharge temperature, a charge/discharge capacity, a charge/discharge frequency, a charge/discharge time, an electrolyte discharge amount, a voltage measurement waiting time, a measurement voltage/current mode, a measured voltage, and a measured voltage drop.

In a specific example, the storing-operation may include an operation of determining an independent variable and a dependent variable among the existing data; and an operation of defining a correlation equation for analyzing a correlation between the independent variable and the dependent variable through a correlation analysis.

In another specific example, the correlation analysis may be a regression analysis with the existing data as the independent variable and the voltage drop correction data as the dependent variable.

In another specific example, the peration of calculating the corrected voltage drop may include: an operation of substituting the detected experimental data as the independent variable of the correlation equation; and an operation of calculating the target voltage drop correction data, which is the dependent variable, by the correlation equation.

Advantageous Effects

According to an exemplary embodiment of the present invention, it is possible to provide a corrected voltage drop considering all variables affecting voltage drop by automatically calculating voltage drop correction data through a regression analysis using big data. Accordingly, it is possible to determine a low-voltage defect with improved accuracy and to select a secondary battery with improved stability.

BRIEF DESCRIPTION OF THE DRAWINGS

FIG. 1 is schematically illustrating a secondary battery low-voltage defect determination system according to an exemplary embodiment of the present invention.

FIG. 2 is illustrating an overall secondary battery low-voltage defect determination system and secondary battery low-voltage defect determination process of the present invention.

FIG. 3 is a flowchart schematically illustrating a secondary battery low-voltage defect determination method according to an exemplary embodiment.

FIG. 4 is a flowchart illustrating a secondary battery low-voltage defect determination method according to an exemplary embodiment in detail.

BEST MODE FOR CARRYING OUT THE INVENTION

Hereinafter, the present invention will be described in detail. First, terms and words used in this specification and claims should not be interpreted as limited to commonly used meanings or meanings in dictionaries and should be interpreted with meanings and concepts which are consistent with the technological scope of the invention based on the principle that the inventors have appropriately defined concepts of terms in order to describe the invention in the best way.

In describing each figure, similar reference numbers have been used for similar components. In the accompanying drawings, the dimensions of the structures are enlarged than the actual for clarity of the present invention. Terms such as the first, the second, etc. may be used to describe various components, but the components should not be limited by the terms. These terms are only used for the purpose of distinguishing one component from another. For example, the first component may be termed the second component, and similarly, the second component may also be termed the first component, without departing from the scope of the present invention. Singular expressions include plural expressions unless the context clearly indicates otherwise.

The terms “comprise,” “include” and “have” used herein designate the presence of characteristics, numbers, steps, actions, components or elements described in the specification or a combination thereof, and it should be understood that the possibility of the presence or addition of one or more other characteristics, numbers, steps, actions, components, elements or a combination thereof is not excluded in advance. In addition, when a part of a layer, film, region or plate is disposed “on” another part, this includes not only a case in which one part is disposed “directly on” another part, but a case in which a third part is interposed therebetween. In contrast, when a part of a layer, film, region or plate is disposed “under” another part, this includes not only a case in which one part is disposed “directly under” another part, but a case in which a third part is interposed therebetween. In addition, in the specification of the present invention, “on” may include not only a case of disposed on an upper part but also a case of disposed on a lower part.

In the exemplary embodiments described below, a secondary battery is a general term for a battery in which lithium ions act as operating ions during charging and discharging to induce an electrochemical reaction between a positive electrode and a negative electrode.

Meanwhile, even if the name is changed depending on the type of an electrolyte or a separation membrane, the type of a battery case (or a packaging material), the internal or external structure of the secondary battery, etc., all should be interpreted as being included in the category of the secondary battery as long as it is a battery in which lithium ions are used as operating ions.

An example of an assembly and an activation process of a secondary battery cell that can be applied to the low-voltage defect determination system and the low-voltage defect determination method of the secondary battery according to the present invention is as follows.

An assembling stage includes a stage of storing an electrode assembly and an electrolyte in a battery case and sealing it in a manufacturing chamber.

First, an electrode assembly including a cathode, an anode, and a separation membrane interposed therebetween is prepared. A manufacturing stage of the electrode assembly includes a stage of applying an electrode slurry that includes an active material and a binder to an electrode current collector to prepare a cathode and an anode, respectively, and then interposing a separation membrane between the cathode and the anode. The stage of manufacturing such an electrode assembly is not particularly limited, and may be performed by a known method. In addition, the electrode assembly is not particularly limited as long as it has a structure including a cathode, an anode, and a separation membrane, and examples thereof include a jelly-roll type, a stack type, or a stack/folding type structure.

The anode in the electrode assembly may include a carbon-based negative electrode active material. The carbon-based negative electrode active material may be an artificial graphite or a natural graphite.

The electrolyte may include an organic solvent and a lithium salt. The organic solvent is not limited as long as it can minimize decomposition due to an oxidation reaction or the like during the charging and discharging of the battery and can exhibit desired characteristics, and it may be, for example, a cyclic carbonate, linear carbonate, ester, ether, or ketone, etc. These may be used alone, or two or more may be used in combination. Among the organic solvents, especially carbonate-based organic solvents may be preferably used.

Specific examples of the cyclic carbonate compound include any one of or a mixture of two or more compounds selected from the group consisting of ethylene carbonate (EC), propylene carbonate (PC), 1,2-butylene carbonate, 2,3-butylene carbonate, 1,2-pentylene carbonate, 2,3-pentylene carbonate, vinylene carbonate, vinyl ethylene carbonate, and halides thereof. The halides thereof include, for example, fluoroethylene carbonate (FEC) and the like, but are not limited thereto.

In addition, specific examples of the linear carbonate compound may include any one or a mixture of two or more compounds selected from the group consisting of dimethyl carbonate (DMC), diethyl carbonate (DEC), dipropyl carbonate, ethyl methyl carbonate (EMC), methyl propyl carbonate, and ethyl propyl carbonate, but are not limited thereto.

Next, the secondary battery manufactured as such proceeds to an activation process.

In general, the activation process may include a pre-aging process, formation process, aging process, degassing process, and shipment charging process. The pre-aging process is a process of storing the electrode assembly in a battery container, injecting an electrolyte, sealing the battery container, and waiting for the electrolyte of the manufactured battery cell to be impregnated. The formation is a process of initially charging a pre-aged battery cell under a preset voltage condition (e.g., a voltage greater than or equal to the SEI film formation of a negative electrode). The aging is a process of preserving the battery cell until it is stabilized in a constant state under a preset voltage condition (e.g., 3.4-3.6V) and temperature condition (e.g., 50-70 degrees). Here, the pre-aging process, the formation process, and the aging process correspond to a wetting period. The degassing process is a process of removing unnecessary gas from an aged battery cell. For example, if the secondary battery is cylindrical or prismatic, the degassing process may be omitted. The shipment charging is a process of charging battery cells under a preset voltage condition (e.g., SOC 20 to 50%) before shipment, and a preset characteristics test (e.g., cell resistance, output, charge/discharge capacity, etc.) may be performed on a corresponding battery cell.

The present invention relates to a secondary battery low-voltage defect determination system that determines a low-voltage defect by calculating voltage drop of the battery before shipment of the secondary battery.

MODE FOR CARRYING OUT THE INVENTION

Hereinafter, a secondary battery low-voltage defect determination system 1000 according to an exemplary embodiment of the present invention will be described with reference to the diagrams.

Figure 1:
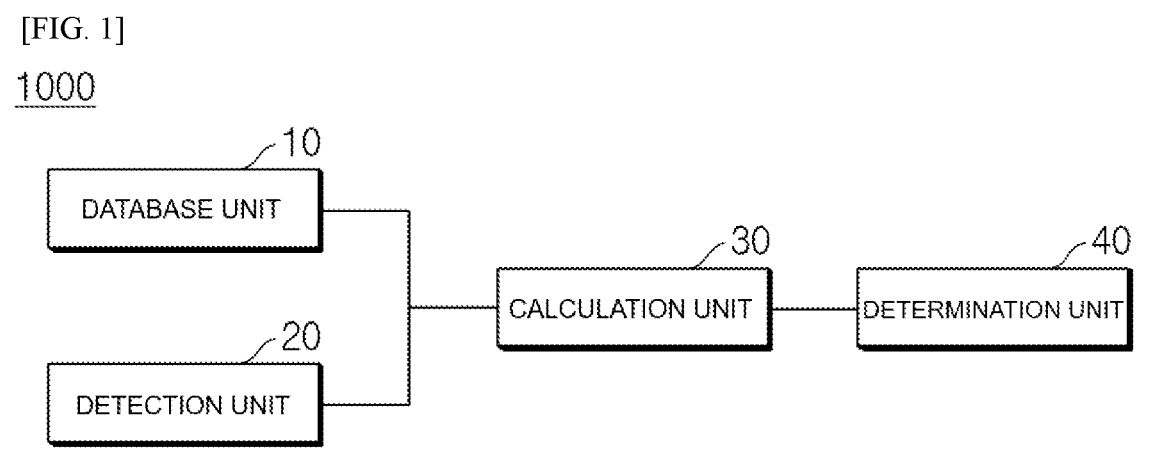

FIG. 1 is a schematic diagram of the secondary battery low-voltage defect determination system 1000 according to an exemplary embodiment of the present invention. As illustrated in FIG. 1, the secondary battery low-voltage defect determination system 1000 may include a database unit 10, a detection unit 20, and a calculation unit 30.

In general, the low-voltage defect determination of the secondary battery diagnoses the voltage defect by measuring voltage drop according to the change of time for a certain period of time after shipment charging, which is the last step in the secondary battery activation process.

As a method for determining the low-voltage defect of existing secondary batteries, whether the battery is defective was determined based on the absolute value of a simple voltage drop, or was determined by making a relative decision in a specific group unit. But the actual voltage drop of a secondary battery can be greatly affected by manufacturing process conditions, the activation process conditions, and charging conditions. Conventionally, because whether the battery has a low-voltage defect was determined by measuring the voltage drop in the same way without considering the process conditions or characteristics of the secondary battery, there has been a possibility of inaccurate determination, and there has been a possibility of human error because the voltage drop was corrected by partially applying the variables affecting the voltage drop directly by a person, and there has also been inconvenience because a person had to perform the correction work every time by each condition.

Accordingly, the present invention provides the secondary battery low-voltage defect determination system with improve accuracy by calculating the corrected voltage drop considering variables that may affect the measurement of the voltage drop of the secondary battery.

In order to achieve the objective mentioned above, the inventors of the present invention invented a big data-based smart system that can distinguish variables that can affect the voltage drop measurement of the secondary battery, derive a correlation between each variable and the corrected voltage drop data using a statistical method to store it in a database unit 10, detect experimental data including variables of the secondary battery to be measured in the detection unit 20 based on the database unit 10, and automatically determine low-voltage defect of batteries by calculating target voltage drop correction data through the calculation unit 30.

According to an exemplary embodiment of the present invention, the secondary battery low-voltage defect determination system 1000 may include: a database unit 10 that stores existing data on battery manufacturing process conditions, activation process conditions, voltage measurement conditions, and battery voltage measured after the activation process; a detection unit 20 that detects experimental data on the manufacturing process conditions, the activation process conditions, the voltage measurement conditions, and the battery voltage measured after the activation process of the battery to be measured; and a calculation unit 30 that calculates voltage drop correction data based on the existing data stored in the database unit 10 and the experimental data detected by the detection unit 20.

Specifically, the existing data stored in the database unit 10 and the experimental data detected by the detection unit 20 may be one or more of battery size, electrolyte injection amount, type of active material, electrode loading amount, N/P ratio, aging temperature, aging time, aging frequency, charge/discharge temperature, charge/discharge capacity, charge/discharge frequency, charge/discharge time, electrolyte discharge amount, voltage measurement waiting time, measurement voltage/current mode, measured voltage, and measured voltage drop.

Meanwhile, as an example of voltage drop measurement method, it may be a method of measuring the voltage drop (i.e., voltage change) of a battery cell from the beginning of self-discharge to a preset time after the voltage of the secondary battery reaches a preset voltage. That is, it may measure the voltage drop during the self-discharge period (i.e., resting period) by performing a self-discharge for a preset time after charging up to a preset voltage in a constant current mode.

At this time, the self-discharge period may be set in advance to be within 24 hours. In addition, the self-discharge period may be set to be at least shorter than the time that takes to measure OCV (Open Circuit Voltage) during a conventional shipment charging.

As a specific example, it may be a method of charging the secondary battery by applying a micro-current at 1/200C in a constant current mode, and measuring an amount of change in voltage while initiating self-discharge for 24 hours when the charging voltage reaches the target voltage of 2.0V.

In addition, as another example of the voltage drop measurement method, it may be a method of measuring the open circuit voltage (V1) of the secondary battery at the time when pre-aging and initial charging are completed and when secondary charging is completed after performing a high-temperature aging, and measuring the open circuit voltage (V2) of the secondary battery at the time when a room-temperature aging is completed to derive a voltage drop (OCV=V1−V2).

Meanwhile, as variables in voltage drop measurement, the battery size, the amount of injected electrolyte, the type of positive or negative electrode active material, the amount of loaded electrode, N/P Ratio, etc. may be a variable that may occur in the secondary battery cell manufacturing process when measuring the voltage drop.

In addition, the aging temperature, the aging time, the aging frequency, the charge/discharge temperature, the charge/discharge capacity, the charge/discharge frequency, the charge/discharge time, electrode discharge amount, etc. may be a variable that may occur in the secondary battery activation process when measuring the voltage drop.

Moreover, the voltage measurement waiting time, the measurement voltage/current mode, the measured voltage, etc. may be a variable that may occur in the secondary battery voltage measurement process when measuring the voltage drop.

In another example, it may further comprise a determination unit 40 that deduces whether the battery has a low-voltage defect by comparing the voltage drop correction data and the reference voltage drop data of a normal battery.

Meanwhile, the database unit 10 may define a correlation equation through a correlation analysis between an independent variable and a dependent variable. Here, the correlation analysis may be a regression analysis. A regression analysis is a statistical technique that explains and predicts the value of a certain variable (dependent variable) from one or more other variables (independent variable) by identifying the relationship between two or more variables. In this case, the independent variable may be one or more types among the existing data stored in the database unit 10, and the dependent variable may be the voltage drop correction data. That is, the database unit 10 defines a correlation equation through a regression analysis between the existing data stored in the database unit 10 and the voltage drop correction data.

The correlation equation can be defined as in Equation 1 below.

$$\text{Dependent Variable}=\text{Independent Variable}\times\text{Coefficient value of Independent Variable}+\alpha \quad \text{[Equation 1]}$$

Here, the independent variable may be one or more types among the existing data stored in the database unit 10, and the dependent variable may be the voltage drop correction data. The coefficient value of the independent variable is calculated by the secondary battery data of the population. In Equation 1, $\alpha$ is a constant value, which is added to predict the dependent variable in the correlation equation. A correlation equation such as Equation 1 may be respectively defined according to the type or priority of the existing data, which is the independent variable. However, the above correlation equation may be changed in some cases. That is, the correlation equation according to the present invention may have various independent variable coefficient values by reflecting the type and application priority of the existing data stored in the database unit 10, and may calculate the dependent variable by using the correlation equation reflecting the type and application priority of the existing data applied to the calculation of the final voltage drop correction data.

Here, the number of secondary batteries serving as the population for the correlation analysis may be from 1,000 to 30,000, but it is not limited thereto.

Meanwhile, the detection unit 20 may detect experimental data on the manufacturing process conditions, the activation process conditions, the voltage measurement conditions, and the battery voltage measured after the activation process of the battery to be measured. That is, the independent variable in Equation 1 is a value substituted to calculate the dependent variable, and the experimental data detected by the detection unit 20 may correspond to the independent variable.

Meanwhile, the calculation unit 30 may calculate the target voltage drop correction data based on the existing data stored in the database unit 10 and the experimental data detected by the detection unit 20. The calculation unit 30 calculates the target voltage drop correction data using a correlation equation defined through the existing data stored in the database unit 10.

Specifically, the calculation unit 30 substitutes the experimental data inputted by the detection unit 20 into the correlation equation defined by the database unit 10 as an independent variable. Here, the calculation unit 30 may determine the correlation equation according to the experimental data detected by the detection unit 20, and may substitute one or more types of experimental data, which are independent variables, into the determined correlation equation. The calculation unit 30 calculates the target voltage drop correction data considering the variables by substituting one or more types of variables affecting the voltage drop measurement into the independent variable in the correlation equation.

Meanwhile, the determination unit 40 may deduce whether the battery has a low-voltage defect by comparing the voltage drop correction data calculated by the calculation unit 30 and the reference voltage drop data of a normal battery.

As an example, when the reference voltage drop data calculated by a statistical method through the voltage drop data of a normal working battery processed to a correction target is 3 mV, the secondary battery is determined as normal if the calculated voltage drop correction data does not exceed this value, and the secondary battery is determined as low-voltage defective if the calculated voltage drop correction data exceeds this value. That is, the secondary battery can be determined as normal if the calculated corrected voltage drop is less than or equal to the value of reference voltage drop data obtained through the voltage drop of a normal battery processed to a correction target, and the secondary battery can be determined as low-voltage defective if it exceeds this value.

FIG. 2 illustrates the overall secondary battery low-voltage defect determination system 1000 and secondary battery low-voltage defect determination process of the present invention. Referring to FIG. 2, the low-voltage defect determination process may proceed through the following order: a secondary battery cell manufacturing process, an activation process, and a voltage measurement process. Here, when determining by measuring the voltage drop using the low-voltage defect determination method, various voltage drop measurement variables may occur in each process.

The voltage drop measurement variables may be one or more of battery size, electrolyte injection amount, type of active material, electrode loading amount, N/P ratio, aging temperature, aging time, aging frequency, charge/discharge temperature, charge/discharge capacity, charge/discharge frequency, charge/discharge time, electrolyte discharge amount, voltage measurement waiting time, measurement voltage/current mode, measured voltage, and measured voltage drop.

Experimental data including variables generated in the process of determining the voltage drop of the secondary battery to be measured and the actually measured voltage drop may be detected by the detection unit 20, and may be transmitted to the calculation unit 30. Here, the calculation unit 30 may receive existing data information stored in the database unit 10 from the database unit 10. Meanwhile, the database unit 10 is a storage that stores voltage drop correction data calculated by considering various voltage drop measurement variables in advance.

The calculation unit may calculate the corrected voltage drop through a specific correlation between the voltage drop measurement variables transmitted through the detection unit and the actually measured voltage drop based on the information stored in the database unit. Thereafter, the voltage drop calculated through the calculation unit is compared with the reference voltage drop of a normal battery to determine the low-voltage defect of the battery, and thus being able to select a good secondary battery.

As described above, in the secondary battery low-voltage defect determination system 1000 according to an exemplary embodiment of the present invention, the voltage drop correction data obtained through a regression analysis based on existing data is stored in the database unit 10, the voltage drop correction data is automatically calculated by the calculation unit 30 when the experimental data is input by the detection unit 20, and the big data-based voltage drop correction data is compared with the reference voltage drop of a normal battery to determine the low-voltage defect. In addition, by providing a voltage drop value considering various variables that may occur when measuring the voltage drop, it is possible to sort low-voltage defective batteries with improved accuracy, thereby improving battery stability.

In addition, the present invention provides a secondary battery low-voltage defect determination method, Meanwhile, the secondary battery low-voltage defect determination method may include contents overlapping with the above-described secondary battery low-voltage defect determination system, and the overlapping descriptions may be omitted.

Hereinafter, the secondary battery low-voltage defect determination method according to an exemplary embodiment of the present invention will be described with reference to the diagrams. FIG. 3 is a flowchart schematically illustrating a secondary battery low-voltage defect determination method to which the secondary battery low-voltage defect determination system 1000 of the present invention is applied.

As illustrated in FIG. 3, the secondary battery low-voltage defect determination method may be composed of: a stage of storing the existing data S100, a stage of detecting the experimental data S200, a stage of calculating the corrected voltage drop S300, and a stage of determining whether the battery has a low-voltage defect S400.

The stage of storing the existing data S100 may be a stage of storing the existing data on battery manufacturing process conditions, activation process conditions, voltage measurement conditions, and measured battery voltage after the activation process.

Meanwhile, the stage of detecting the experimental data S200 may be a stage of detecting experimental data on the manufacturing process conditions, the activation process conditions, the voltage measurement conditions, and the measured battery voltage after the activation process of the battery to be measured.

Specifically, the existing data in the stage of storing the existing data S100 and the experimental data in the stage of detecting the experimental data S200 may be one or more of battery size, electrolyte injection amount, type of active material, electrode loading amount, N/P ratio, aging temperature, aging time, aging frequency, charge/discharge temperature, charge/discharge capacity, charge/discharge frequency, electrolyte discharge amount, voltage measurement waiting time, measurement voltage/current mode, measured voltage, and measured voltage drop.

More specifically, as variables in voltage drop measurement, the battery size, the amount of injected electrolyte, the type of positive or negative electrode active material, the amount of loaded electrode, N/P Ratio, etc. may be a variable that may occur in the secondary battery cell manufacturing process when measuring the voltage drop.

In addition, the aging temperature, the aging time, the aging frequency, the charge/discharge temperature, the charge/discharge capacity, the charge/discharge frequency, the charge/discharge time, electrode discharge amount, etc. may be a variable that may occur in the secondary battery activation process when measuring the voltage drop.

Moreover, the voltage measurement waiting time, the measurement voltage/current mode, the measured voltage, etc. may be a variable that may occur in the secondary battery voltage measurement process when measuring the voltage drop. Meanwhile, the stage of storing the existing data may consist of a stage of determining the independent variable and the dependent variable among the stored existing data S110, followed by a stage of defining a correlation equation for a correlation analysis between the determined independent variable and the dependent variable S120. Here, the correlation analysis may be a regression analysis. In this case, the independent variable may be the stored existing data, and the dependent variable may be the voltage drop correction data. The correction equation may be defined as in the Equation 1 above. Here, the independent variable may be any one or more types among the stored existing data, and the dependent variable may be the voltage drop correction data based on the existing data, which is designated as an independent variable. Here, the correlation equation may be defined according to the type or the priority of the existing data, which is an independent variable, respectively.

The stage of detecting the experimental data S200, as described above, may be a stage of detecting experimental data on the manufacturing process conditions, the activation process conditions, the voltage measurement conditions, and the measured battery voltage after the activation process of the battery to be measured.

The stage of calculating the corrected voltage drop S300 may be a stage of calculating the corrected voltage drop based on the voltage drop correction data and the detected experimental data according to the stored existing data. Specifically, the target voltage drop correction data may be calculated using the correlation equation defined through the stored existing data. More specifically, the stage of calculating the corrected voltage drop S300 may include a stage of substituting the experimental data into the correlation equation as an independent variable S310 and a stage of calculating the target voltage drop correction data, which is the dependent variable, by the correlation equation S320. As described above, the target voltage drop correction data according to the designated independent variable is calculated by using one or more of various variables that can affect the voltage drop when measuring the voltage drop of the secondary battery to be measured as an independent variable that is substituted into the correlation equation of the experimental data.

In addition, after the stage of calculating the corrected voltage drop S300, a stage of determining whether the battery has a low-voltage defect S400 by comparing the corrected voltage drop with the reference voltage drop of a normal battery may be further included.

For this reason, the secondary battery low-voltage defect determination method of the present invention can improve the accuracy of determining the secondary battery low-voltage defect by calculating the correction value of the actually measured voltage drop considering variables when measuring the voltage drop of the secondary battery.

As above, the present invention has been described with reference to exemplary embodiments, but it should be understood by those skilled in the art or those of ordinary skill in the art that the present invention can be variously modified and changed without departing from the spirit and technical scope of the present invention described in the accompanying claims.

Accordingly, the technical scope of the present invention is not limited to the content described in the detailed description of the specification, but should be defined by the claims.

REFERENCE NUMERALS

10: DATABASE UNIT
20: DETECTION UNIT
30: CALCULATION UNIT
40: DETERMINATION UNIT
1000: SECONDARY BATTERY LOW-VOLTAGE DEFECT DETERMINATION SYSTEM

The invention claimed is:

1. A secondary battery low-voltage defect determination system, comprising:

a database configured to store existing data on battery manufacturing process conditions, activation process conditions, voltage measurement conditions, and a battery voltage measured after an activation process of a battery;

a detector configured to detect experimental data on the battery manufacturing process conditions, the activation process conditions, the voltage measurement conditions, and the battery voltage measured after the activation process of the battery;

a calculator configured to calculate target voltage drop correction data based on the existing data stored in the database and the experimental data detected by the detector; and a determinator configured to determine whether the battery has a defect by comparing the target voltage drop correction data and a reference voltage drop data of a normal battery, wherein the target voltage drop correction data is based on applying a micro-current in a constant current mode, and measuring an amount of change in voltage while initiating self-discharge for a set period when a charging voltage reaches a target voltage.

2. The secondary battery low-voltage defect determination system of claim 1, wherein the existing data stored in the database and the experimental data detected by the detector include one or more of:

a battery size, an electrolyte injection amount, a type of active material, an electrode loading amount, a negative/positive (N/P) ratio, an aging temperature, an aging time, an aging frequency, a charge/discharge temperature, a charge/discharge capacity, a charge/discharge frequency, a charge/discharge time, an electrolyte discharge amount, a voltage measurement waiting time, a measurement voltage/current mode, a measured voltage, and a measured voltage drop.

3. The secondary battery low-voltage defect determination system of claim 2, wherein the measured voltage drop is measured during a self-discharge period.

4. The secondary battery low-voltage defect determination system of claim 3, wherein the self-discharge period is approximately 24 hours.

5. The secondary battery low-voltage defect determination system of claim 1, wherein the database defines a correlation equation through a correlation analysis between the existing data and the target voltage drop correction data.

6. The secondary battery low-voltage defect determination system of claim 5, wherein the correlation analysis is a regression analysis with the existing data as an independent variable and the target voltage drop correction data as a dependent variable.

7. The secondary battery low-voltage defect determination system of claim 5, wherein the calculator calculates the target voltage drop correction data by substituting the experimental data detected by the detector as an independent variable into the correlation equation.

8. The secondary battery low-voltage defect determination system of claim 5, wherein a number of batteries serving as a population for the correlation analysis is from about 1,000 to 30,000.

9. The secondary battery low-voltage defect determination system of claim 1, wherein the defect to be determined is a low-voltage defect.

10. A secondary battery low-voltage defect determination method using a secondary battery low-voltage defect determination system, the secondary battery low-voltage defect determination method comprising:

storing, in a database, existing data on battery manufacturing process conditions, activation process conditions, voltage measurement conditions after an activation process, and a measured battery voltage of a battery;

detecting, by a detector, experimental data on the battery manufacturing process conditions, the activation process conditions, the voltage measurement conditions after the activation process, and the measured battery voltage of the battery;

calculating, by a calculator, a corrected voltage drop based on the stored existing data and the detected experimental data; and determining, by a determinator, whether the battery has a defect by comparing the corrected voltage drop and a reference voltage drop of a normal battery after the calculating the corrected voltage drop, wherein the corrected voltage drop is based on applying a micro-current in a constant current mode, and measuring an amount of change in voltage while initiating self-discharge for a set period when a charging voltage reaches a target voltage.

11. The secondary battery low-voltage defect determination method of claim 10, wherein the stored existing data and the detected experimental data includes one or more of:

a battery size, an electrolyte injection amount, a type of active material, an electrode loading amount, a negative/positive (N/P) ratio, an aging temperature, an aging time, an aging frequency, a charge/discharge temperature, a charge/discharge capacity, a charge/discharge frequency, an electrolyte discharge amount, a voltage measurement waiting time, a measurement voltage/current mode, a measured voltage, and a measured voltage drop.

12. The secondary battery low-voltage defect determination method of claim 10, wherein the storing the existing data comprises:

determining an independent variable and a dependent variable among the existing data; and defining a correlation equation for analyzing a correlation between the independent variable and the dependent variable through a correlation analysis.

13. The secondary battery low-voltage defect determination method of claim 12, wherein the correlation analysis is a regression analysis with the existing data as the independent variable and a target voltage drop correction data as the dependent variable.

14. The secondary battery low-voltage defect determination method of claim 12, wherein the calculating the corrected voltage drop comprises:

substituting the detected experimental data as the independent variable of the correlation equation; and calculating a target voltage drop correction data, which is the dependent variable, by the correlation equation.

* * * * *